(12) United States Patent
Elger

(10) Patent No.: US 9,198,302 B2
(45) Date of Patent: Nov. 24, 2015

(54) METHOD OF SOLDERING AN ELECTRONIC COMPONENT WITH A HIGH LATERAL ACCURACY

(71) Applicant: KONINKLIJKE PHILIPS N.V., Eindhoven (NL)

(72) Inventor: Gordon Patrick Rudolf Elger, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/414,918

(22) PCT Filed: Jul. 17, 2013

(86) PCT No.: PCT/IB2013/055892
§ 371 (c)(1),
(2) Date: Jan. 15, 2015

(87) PCT Pub. No.: WO2014/013463
PCT Pub. Date: Jan. 23, 2014

(65) Prior Publication Data
US 2015/0223347 A1    Aug. 6, 2015

Related U.S. Application Data

(60) Provisional application No. 61/672,808, filed on Jul. 18, 2012.

(51) Int. Cl.
*B23K 35/14* (2006.01)
*H05K 3/34* (2006.01)
(Continued)

(52) U.S. Cl.
CPC ............ *H05K 3/3484* (2013.01); *B23K 1/0016* (2013.01); *B23K 35/025* (2013.01);
(Continued)

(58) Field of Classification Search
CPC ............ B23K 35/262; B23K 35/0244; B23K 35/025; B23K 1/0016; B23K 2201/36; B23K 2201/42; B23K 35/302; B23K 35/362; B23K 35/40; H01L 24/29; H01L 24/83; H01L 23/492; H01L 23/49816; H01L 23/49866; H01L 24/32; H01L 24/81
USPC .................................... 228/56.3, 122.1, 123.1
See application file for complete search history.

(56) References Cited

U.S. PATENT DOCUMENTS

| 6,848,171 B2 | 2/2005 | Kuriyama et al. |
| 8,235,275 B1 * | 8/2012 | Stankowski et al. ......... 228/56.3 |
| 2003/0224197 A1 | 12/2003 | Soga et al. |
| 2009/0236725 A1 | 9/2009 | Hirano et al. |

(Continued)

FOREIGN PATENT DOCUMENTS

| CN | 102328157 A | 1/2012 |
| EP | 1837119 A | 9/2007 |

(Continued)

*Primary Examiner* — Erin Saad
(74) *Attorney, Agent, or Firm* — Patent Law Group LLP; Brian D Ogonowsky

(57) ABSTRACT

The present invention relates to a method of soldering an electronic component (3) to a substrate (1) with high accuracy using transient liquid phase soldering. The component (3) is exactly positioned above the substrate (1) with a handling tool, placed in the melted solder (2) and pressed against the substrate (1). The component (3) is then released and the solder (2) allowed solidifying. Due to the use of a solder (2) having a sufficiently high amount of a second metal or metal alloy of a higher melting point which only partly dissolves in the melted first metal or metal alloy of a lower melting point, a solid framework forms during the liquid phase soldering which inhibits a lateral movement of the placed component (3) during soldering. Since the positioning of the component (3) is made using exact reference features on the substrate (1), the whole soldering process results in a highly accurate lateral position of the soldered component.

4 Claims, 1 Drawing Sheet

(51) Int. Cl.
*B23K 1/00* (2006.01)
*B23K 35/02* (2006.01)
*B23K 35/26* (2006.01)
*B23K 35/30* (2006.01)
*C22C 9/00* (2006.01)
*C22C 13/00* (2006.01)

(52) U.S. Cl.
CPC ............. *B23K35/262* (2013.01); *B23K 35/302* (2013.01); *C22C 9/00* (2013.01); *C22C 13/00* (2013.01); *H05K 3/3431* (2013.01); *H05K 2203/04* (2013.01)

(56) References Cited

U.S. PATENT DOCUMENTS

2012/0018048 A1    1/2012   Yamashita et al.
2012/0119392 A1    5/2012   Breer et al.

FOREIGN PATENT DOCUMENTS

| JP | 20222905 A | 8/2002 |
| JP | 2003245793 A | 9/2003 |
| JP | 2007268569 A | 10/2007 |
| WO | 2012066795 A | 5/2012 |

\* cited by examiner

METHOD OF SOLDERING AN ELECTRONIC COMPONENT WITH A HIGH LATERAL ACCURACY

CROSS-REFERENCE TO PRIOR APPLICATIONS

This application is the U.S. National Phase application under 35 U.S.C. §371 of International Application No. PCT/IB 2013/055892, filed on Jul. 17, 2013, which claims the benefit of U.S. patent application No. 61/672,808, filed on Jul. 18, 2012. These applications are hereby incorporated by reference herein.

TECHNICAL FIELD AND BACKGROUND

The present invention relates to a method of soldering an electronic component to a substrate by transient liquid phase soldering, wherein a solder paste is deposited and melted on the substrate, the electronic component is placed in the melted solder by a handling tool and the melted solder is allowed to solidify.

When soldering electronic components to a substrate a problem arises in the field of optoelectronics or other applications in which the components need to be placed very accurate on the substrate. For example, the optical center of light emitting surfaces of LEDs have to be positioned very accurate with respect to reference features of the substrate or board to enable cost effective and accurate assembly of a head lamp, i.e. assembly of the primary and secondary optics. In many applications PCB-boards (PCB: printed circuit board) are used as the substrate to which the electronic components have to be soldered. The tolerances of the PCB industry are large, typically in the order of 100 μm, in comparison with optoelectronic requirements in the range of 10 μm. The tolerance chain, e.g. reference features to pads, reflow soldering, top to bottom feature tolerance of the carrier, add to over 100 μm.

Transient liquid phase (TLP) solder pastes based on standard SAC paste (SAC: SnAgCu) are currently under development to form high reliable bonds for high temperature applications. TLP soldering in general has the advantage that a solder joint is formed at a low temperature but remelts at a significant higher temperature, i.e. the solder solidifies during the solder process. For many optoelectronic applications, as for example automotive low and high beam modules, a very high post soldering accuracy is required, i.e. in the range of 10 μm. Standard reflow processes cannot reach such a high accuracy because the reflow process itself has a tolerance (standard deviation 5 to 10 μm) and in addition the tolerance between solder pads and reference structures on the boards are also in the order of 50 μm. Therefore the known process of self alignment of electronic components on a liquid solder surface does not allow the exact positioning of the electronic component.

SUMMARY OF INVENTION

It is an object of the present invention to provide a method of soldering an electronic component to a substrate which method allows a high positioning accuracy fulfilling the requirements of optoelectronic applications.

The object is achieved with the method according to claim 1. Advantageous embodiments of the method are subject matter of the dependent claims or are described in the following portions of the description and embodiments.

In the proposed method the electronic component is soldered to the substrate by transient liquid phase soldering. A solder paste enabling transient liquid phase soldering is deposited on the substrate at least at the contact pads to which corresponding contact pads on the electronic component have to be soldered. The solder paste can be deposited by known processes, for example by printing or dispensing the solder paste on the substrate. The substrate can be any appropriate carrier for the electronic components, in particular a carrier board with electrical wiring, for example a PCB, an IMS (IMS: insulated metal substrate), a Molded Interconnect Device (MID). The solder paste on the substrate is melted for transient liquid phase soldering and the electronic component is positioned above the substrate by an appropriate handling tool, e.g. a bonder device. Such bonder devices for bonding or soldering small components to a substrate are known in the art and are commercially available. The exact lateral positioning of the electronic component over the substrate is achieved by using reference features or structures on the substrate which are independent from the contact pads on the substrate. Such reference features may be mechanical features like edges or boreholes which are used for the mounting of the substrate in the corresponding application. The reference features may also be metallization or other marks which fulfil the accuracy requirement for the corresponding application. The reference features are detected with optical means which usually are already part of the handling tool, e.g. bonder device. After this exact positioning the component is placed by the handling tool at this position into the melted solder paste and pressed with a slight force against the substrate. The solder paste solidifies already partly immediately when the component is placed and released by the handling tool. The solder paste used with the proposed method contains a mixture of particles of different metals and/or of one or several metal alloys, at least one first metal or metal alloy melting at the desired low temperature of the transient liquid phase soldering process and at least another second metal or metal alloy melting at a higher temperature. In the proposed method a solder paste of almost eutectic composition is used in which particles of the second metal or metal alloy melting at a higher temperature are included in such a high amount that during the transient liquid phase soldering only a portion of these metal particles dissolve in the liquid solder. Intermetallic phases form between the remaining solid particles. This results in the formation of a solid framework within the still liquid solder which inhibits a lateral movement of the components placed in this solder paste. Inhibiting the lateral movement of the components allows the maintenance of the high lateral positioning accuracy achieved with the handling tool also after placement of the components until the solder paste is solidified.

With the proposed method thus the electronic components are soldered on a substrate with a high positioning accuracy suitable for optoelectronic applications. Since the positioning accuracy of known bonder devices is in the range of 5 to 10 μm or even higher (up to 1 μm) the electronic components can be soldered with a similar accuracy to the substrate. This is on the one hand due to the composition of the solder paste in which the electronic components due to the formation of the solid framework cannot laterally move after placement under slight pressure and thus are soldered at the position at which the handling tool has placed the components. Due to the positioning relative to reference features of the substrate on the other hand which are arranged with a higher accuracy than the contact pads, the whole process achieves the desired accurate positioning. With the proposed method, for example, a LED package for a lamp can be soldered to a carrier substrate with high accuracy required for optoelectronic applications. Since the LED package does not move after placement anymore, the LED's are positioned exactly in reference to precise reference features or structures which are used for the assembly of the primary and secondary optics of the lamp.

In a preferred embodiment, a portion of the second metallic particles are so called type 5 particles, i.e. metallic spheres having a size (diameter) of between 40 and 60 µm. These spheres can also act as stand-offs and enable a sufficient bond line thickness to form a reliable solder joint.

The second metallic particles are included in the solder paste preferably with a fraction of between 20 and 40 wt % (weight percent) in relation to all metallic particles present in the solder paste. With such a fraction of the second metallic particles, the requirements for forming the desired solid framework are optimally fulfilled.

In a further preferred embodiment, the solder paste is a SAC solder paste comprising a SnAgCu alloy as metallic particles. In addition to the low amount of Cu (0.5 wt. %) in the SnAgCu alloy, the Cu portion is raised by adding pure copper spheres to a significantly higher amount such that most of the Cu does not dissolve in the melted Sn and forms the desired solid framework. Due to the formation of CuSn intermetallics solid bonds are formed from the contact pad of the component to the contact pad of the substrate. Since the copper spheres are in contact with both pads after placing the component, the component does not move after placement anymore and is soldered at the desired position because a solid framework builds up from substrate pad to component pad.

BRIEF DESCRIPTION OF THE DRAWINGS

The proposed method is described in the following by way of an example in connection with the accompanying drawings without limiting the scope of protection as defined by the claims. The figures show:

DETAILED DESCRIPTION OF EMBODIMENTS

In the following the proposed method is described using a SnAgCu solder paste. The paste is prepared based on a commercially available SAC paste which typically contains 96 wt. % Sn, 3.5 wt. % Ag and 0.5 wt. % Cu. To such a paste solid copper spheres having a diameter of 40 to 60 µm and optionally also small spheres with diameters between 10 and 25 µm are added. The proportion of the copper spheres is adjusted such that during reflow the copper spheres are still surrounded by a liquid Sn matrix (10 to 15% copper sphere volume, 35 to 40% SnAg volume and 50% flux volume).

Figure 1:
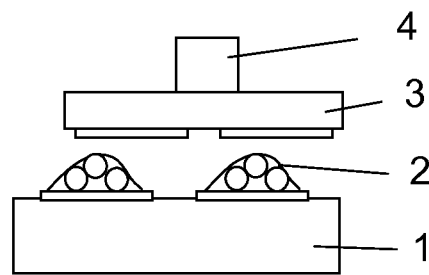
FIG. 1 schematically a first process step of the proposed method.

The prepared solder paste 2 is printed on the board 1 to which the component 3 is to be soldered. The solder 2 is melted in the assembly machine at temperatures between 230° C. and 260° C. The component 3 is then positioned above the board 1 as indicated in FIG. 1. The component 1 is aligned to reference features (not shown in the figures) instead of the solder pads, in order to achieve the desired exact positioning. FIG. 1 also schematically shows the grab or bond tool 4 of the bonder device (assembly machine) which grabs and positions the component 3. The reference features depend on the application of the component. The features are selected to guarantee the desired positioning accuracy of the component with respect to other features of the application, like a primary optics in which the board will be mounted later.

Figure 2:
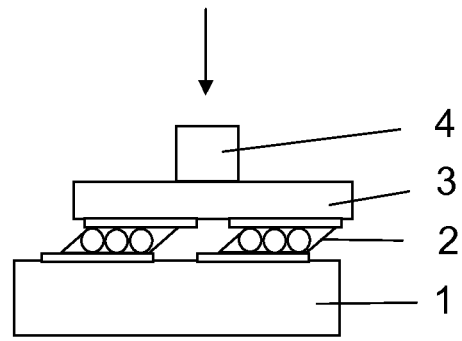
FIG. 2 schematically a second process step of the proposed method.

After positioning the component is pressed with a small force of 10 g-200 g (0.1 N-20 N) into the pasty solder, i.e. the solder 2 consists out of a liquid phase with solid particles. To this end the bond tool 4 moves down with a controlled force as shown with the arrow in FIG. 2. The copper particles in the solder 2 are squeezed together and a solid matrix builds up which consists out of Cu and CuSn phases. The solid matrix is surrounded by liquid solder. In order to achieve the correct position of the contact pads, these contact pads are oversized, i.e. are designed with a sufficiently large pad area, since the depositing of the pads on the boards is usually made with a low positioning accuracy.

Figure 3:
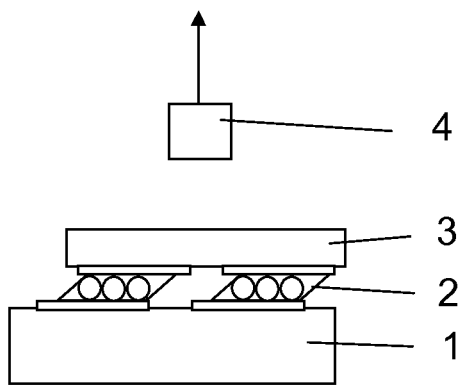
FIG. 3 schematically a third process step of the proposed method.

When the component is placed in the liquid solder the spheres can still move. The solder is squeezed together during placement. A solid matrix between the component pad and the board pad is formed when the component is slightly pressed against the board. At this time the placed component cannot move after the placement anymore due to the solid framework formed of the remaining Cu particles and intermetallic phases. The bond tool 4 can then release the component and the solder solidifies without any further movement of the component (FIG. 3). With this process a highly accurate and highly reliable interface is formed.

The process can be applied in high power LED architecture, e.g. for automotive forward lighting, but also for any other applications in which the soldering of an electronic component has to be performed with a high lateral accuracy.

While the invention has been illustrated and described in detail in the drawings and forgoing description, such illustration and description are to be considered illustrative or exemplary and not restrictive. The invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope of the claims.

List of Reference Signs
1 board
2 solder paste
3 electronic component
4 bond tool

The invention claimed is:

1. A method of soldering an electronic component to a substrate by transient liquid phase soldering, the method comprising
    depositing a solder paste allowing transient liquid phase soldering on contact pads of the substrate,
    melting the solder paste at a temperature of the transient liquid phase soldering,
    positioning the component above the substrate with a handling tool (4) using alignment features on the substrate,
    pressing the component with the handling tool (4) in the melted solder paste,
    releasing the component, and
    allowing the melted solder paste to solidify,
    wherein a solder paste is used which contains a mixture of particles of different metals and/or of metal alloy(s), at least a first metal or metal alloy of said mixture melting at the temperature of the transient liquid phase soldering and at least a second metal or metal alloy of said mixture melting at a higher temperature, metal particles of the second metal or metal alloy being included in such a high amount in the solder paste that during the transient liquid phase soldering only a portion of these metal particles of the second metal or metal alloy dissolve in the melted solder paste and an intermetallic phase forms with the melted first metal or metal alloy at the particle surface between the remaining particles, resulting in the formation of a solid framework within the melted solder paste, wherein a portion of the metallic particles of the second metal or metal alloy is selected to comprise metallic spheres having a diameter of between 40 and 60 μm, said portion being larger than 50 wt% of the metallic particles of the second metal or metal alloy.

2. The method according to claim 1, wherein the solder paste (2) comprises a SnAgCu alloy as the first metal alloy and Cu as the second metal.

3. The method according to claim 1 wherein a fraction of the metallic particles of the second metal or metal alloy is selected to be between 20 and 40 wt. % in relation to all metallic particles in the solder paste.

4. The method according to claim 1, wherein said component is a light emitting diode package.

* * * * *